United States Patent
Das et al.

(10) Patent No.: US 11,492,709 B2
(45) Date of Patent: Nov. 8, 2022

(54) METHOD AND COMPOSITION FOR ETCHING MOLYBDENUM

(71) Applicant: ENTEGRIS, INC., Billerica, MA (US)

(72) Inventors: Atanu K. Das, Danbury, CT (US); Daniela White, Ridgefield, CT (US); Emanuel I. Cooper, Scarsdale, NY (US); Eric Hong, Seongnam (KR); JeongYeol Yang, Gunpo (KR); Juhee Yeo, Suwon (KR); Michael L. White, Ridgefield, CT (US); SeongJin Hong, Cheongju (KR); SeungHyun Chae, Gunpo (KR); Steven A. Lippy, Brookfield, CT (US); WonLae Kim, Gunpo (KR)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/230,633

(22) Filed: Apr. 14, 2021

(65) Prior Publication Data

US 2021/0324525 A1 Oct. 21, 2021

Related U.S. Application Data

(60) Provisional application No. 63/009,716, filed on Apr. 14, 2020.

(51) Int. Cl.
*C23F 1/38* (2006.01)
*H01L 21/3213* (2006.01)

(52) U.S. Cl.
CPC .......... *C23F 1/38* (2013.01); *H01L 21/32134* (2013.01)

(58) Field of Classification Search
None
See application file for complete search history.

(56) References Cited

U.S. PATENT DOCUMENTS

| | | | |
|---|---|---|---|
| 9,074,286 B2 * | 7/2015 | Mayer | C25D 5/48 |
| 9,431,292 B1 * | 8/2016 | Bonilla | H01L 21/76873 |
| 2009/0215269 A1 * | 8/2009 | Boggs | C09K 3/1463 |
| | | | 438/693 |
| 2010/0301010 A1 * | 12/2010 | Lin | C23F 1/26 |
| | | | 216/41 |
| 2010/0320457 A1 * | 12/2010 | Matsubara | H01L 29/45 |
| | | | 257/43 |
| 2011/0104840 A1 * | 5/2011 | Burdinski | C23F 1/30 |
| | | | 438/34 |
| 2013/0026134 A1 * | 1/2013 | Nakagawa | H01L 21/0337 |
| | | | 216/55 |
| 2014/0014615 A1 * | 1/2014 | Yube | G03F 7/20 |
| | | | 216/13 |
| 2014/0038420 A1 * | 2/2014 | Chen | H01L 21/32134 |
| | | | 438/754 |
| 2015/0045277 A1 * | 2/2015 | Liu | C11D 7/3245 |
| | | | 510/175 |
| 2015/0048053 A1 | 2/2015 | Cordonier | |
| 2015/0114429 A1 * | 4/2015 | Jenq | C11D 7/3209 |
| | | | 134/2 |
| 2015/0162213 A1 * | 6/2015 | Chen | C23F 1/28 |
| | | | 438/754 |
| 2016/0186057 A1 * | 6/2016 | Yube | C23F 1/34 |
| | | | 216/83 |
| 2017/0107460 A1 * | 4/2017 | Liu | H01L 21/31111 |
| 2018/0298500 A1 | 10/2018 | Takahashi | |
| 2020/0035485 A1 * | 1/2020 | Chen | H01L 21/02068 |
| 2021/0179972 A1 * | 6/2021 | Champion | C07D 295/13 |

FOREIGN PATENT DOCUMENTS

| | | | | |
|---|---|---|---|---|
| CN | 103060810 A | 4/2013 | | |
| CN | 105887089 A | 8/2016 | | |
| KR | 20110085254 A | 7/2011 | | |
| TW | I640656 B | 11/2018 | | |
| WO | WO-2007044446 A1 * | 4/2007 | ......... | C11D 11/0047 |
| WO | WO-2013101907 A1 * | 7/2013 | ......... | C11D 11/0047 |

* cited by examiner

*Primary Examiner* — Allan W. Olsen

(57) ABSTRACT

An etchant composition and method for etching molybdenum from a microelectronic device at an etch rate are described. A microelectronic device is contacted with an etchant composition for a time sufficient to at least partially remove the molybdenum. The etchant composition comprises at least one oxidizing agent, at least one oxidizing agent stabilizer, and at least one base and has a pH of from 7.5 to 13. The etchant composition selectively removes molybdenum at an etch rate of 5-200 Å/min.

17 Claims, No Drawings

METHOD AND COMPOSITION FOR ETCHING MOLYBDENUM

CROSS-REFERENCE TO RELATED APPLICATIONS

This application claims the benefit under 35 USC 119 of U.S. Provisional Patent Application No. 63/00913,716 filed Apr. 14, 2020, the disclosure of which is hereby incorporated herein by reference in its entirety.

FIELD OF THE INVENTION

The present disclosure relates to a composition and process for selectively etching molybdenum or molybdenum-based alloys relative to other metal components such as titanium nitride (TiN) and insulator materials (i.e., low-k dielectrics). More particularly the present disclosure describes an etchant composition having a high pH that removes molybdenum at a target etch rate of 30-200 Å/min.

BACKGROUND

Typically, tungsten and tungsten-based materials are used as the electrodes in 3D-NAND fabrication. However, tungsten materials have been found to be sensitive to various etchant compositions. For example, in a process using an W electrode, acidic compositions including phosphoric acid and nitric acid used for electrode isolation (the so-called "W recess") were found to cause partial etching of the tungsten layer.

Currently, 3D-NAND structures are finding utility in memory devices. In order to achieve better efficiency in memory performance, 3D-NAND manufacturers have investigated other materials that can lead to superior performance in memory devices. In particular, many 3D-NAND manufacturers have replaced the W layers with molybdenum. As a result, manufacturers require etchant compositions that can selectively remove the Mo in the recesses without removing TiN. Of particular interest is an etchant composition that can selectively remove molybdenum at an etch rate such that each recess achieves a substantially the same targeted etch depth under the controlled etching conditions.

SUMMARY OF THE INVENTION

The present disclosure generally relates to an etchant composition and method for selectively removing molybdenum from a microelectronic device. Advantageously, the etchant composition removes molybdenum at an etch rate sufficient to efficiently and effectively achieve a substantially consistent etch depth in Mo-containing recesses of a 3D-NAND device.

In one embodiment, the present disclosure relates to an etchant composition for removing molybdenum. The composition comprises at least one oxidizing agent, at least one oxidizing agent stabilizer, at least one base, and water. The etchant composition is free of ammonia or ammonium hydroxide and has a pH of from 7.5 to 12. At this pH, and with the inclusion of an oxidizing agent stabilizer, the etchant composition removes molybdenum at an etch rate of 5-200 Å/min.

In another embodiment, the present disclosure relates to a method of removing molybdenum from a microelectronic device at a targeted etch rate. The method comprises contacting the microelectronic device with an etchant composition for a time sufficient to at least partially remove the molybdenum from the microelectronic device. The etchant composition comprises at least one oxidizing agent, at least one oxidizing agent stabilizer, at least one base, and water. The etchant composition is free of ammonia or ammonium hydroxide and has a pH of from 7.5 to 12. The method further comprises etching molybdenum at an etch rate of 5-200 Å/min.

Other aspects, features and advantages will be more fully apparent from the ensuing disclosure and appended claims. It has been found that such an etchant composition can achieve sufficiently controlled etching of molybdenum without over etching, while simultaneously providing selectivity for removing molybdenum in the presence of other metal components, particularly TiN. Such compatibility and etching control are of considerable benefit, for example in the fabrication of 3D-NAND devices.

DETAILED DESCRIPTION OF THE INVENTION

The present invention relates generally to aqueous or semi-aqueous compositions useful for the removal of molybdenum and molybdenum-containing materials from a microelectronic device having such material(s) thereon. The compositions are particularly useful for the selective removal of molybdenum in the presence of TiN.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. A particularly preferred microelectronic is a 3D-NAND device. It is to be understood that the terms "microelectronic device," "microelectronic substrate" and "microelectronic device structure" are not meant to be limiting in any way and include any substrate or structure that will eventually become a microelectronic device or microelectronic assembly.

The microelectronic device comprises a molybdenum-containing material. As used herein, "molybdenum-containing material" and "molybdenum" include any material comprising greater than 50 wt % elemental molybdenum, based on the total weight of the material. Examples of molybdenum-containing materials include, but are not limited to, pure molybdenum (Mo) and alloys or mixtures containing molybdenum. For example, it is known that molybdenum deposited during the manufacture of microelectronic devices may also contain aluminum (Mo—Al) or titanium (Mo—Ti), generally at less than 5 wt %, and "molybdenum" would include these materials. It should be understood by the person skilled in the art that the chemical formula for the various molybdenum species can vary based on the oxidation state of the molybdenum ion, wherein the common oxidation states of molybdenum are −3, −1, +1, +2, +3, +4, +5 or +6.

As used herein, "titanium nitride" and "TiN$_x$" correspond to pure titanium nitride as well as impure titanium nitride including varying stoichiometries, and oxygen content (Ti-O$_x$N$_y$)

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "metal conductor layer" or "metal layer" comprises copper, tungsten, cobalt, aluminum, ruthenium, alloys comprising same, and combinations thereof.

"Substantially devoid" is defined herein as less than 2 wt. %, preferably less than 1 wt. %, more preferably less than 0.5 wt. %, and most preferably less than 0.1 wt. %. In one embodiment, "substantially devoid" corresponds to zero percent, indicating that the composition is free of a particular component.

As used herein, "about" is intended to correspond to ±5% of the stated value.

Compositions described herein may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that, in instances where such components are present, they may be present at concentrations as low as 0.001 weight percent, based on the total weight of the composition in which such components are employed.

Throughout the description and claims of this specification, the words "comprise" and "contain" and variations of the words, for example "comprising" and "comprises", mean "including but not limited to" and do not exclude other components, integers or steps. However, wherever the word "comprising" is used, an embodiment in which "comprising" is read as "consisting of" or "consisting essentially of" is also explicitly embraced.

Herein, the singular encompasses the plural unless the context otherwise requires. In particular, where the indefinite article is used, the specification is to be understood as contemplating plurality as well as singularity, unless the context requires otherwise.

Preferred features of each aspect of the invention may be as described in connection with any of the other aspects. Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible.

The present disclosure relates to an etchant composition and method for selectively removing molybdenum from a microelectronic device, particularly from a high aspect ratio region of the device. Typical water-based molybdenum etchant compositions for such a device have included an oxidizing agent and have been maintained at a low pH (i.e., less than 7). The present inventors have determined, after extensive investigation, that under these acidic oxidative conditions, the molybdenum region to be removed becomes oxidized to $MoO_x$ (such as $MoO_4^{-2}$). Based on phase diagram analyses, it was determined that effectively dissolving these species in aqueous acidic compositions is very difficult, leading to reduced etching rates. Aqueous alkaline formulations would be preferred to effectively remove or prevent the formation of an oxidized molybdenum layer. However, under high pH conditions, many oxidizing agents, including hydrogen peroxide, would be expected to decompose, reducing the amount of oxidant available and, correspondingly, decreasing the effectiveness of the etchant compositions.

Therefore, in order to controllably etch molybdenum-based materials from a microelectronic device, one embodiment of the present disclosure relates to an etchant composition that comprises, consists of, or consists essentially of at least one oxidizing agent, at least one oxidizing agent stabilizer, and at least one base. The etchant composition can be aqueous or semi-aqueous and has a pH of from 7.5 to 13. It has surprisingly been found that the inclusion of an oxidizing agent stabilizer in a high pH etch composition prevents significant decomposition of the oxidizing agent and provides an efficient and effective composition for removing molybdenum from high aspect ratio regions of a microelectronic device, with an etch rate that can be controlled to be between 5-200 Å/min. Etchant compositions that remove Mo at etch rates greater than 200 Å/min would be undesirable, particular for high aspect ratio regions, such are recess with 3D-NAND structures, since achieving removal of Mo from each recess consistently and to a desired etch depth (such as 20-30 nm) would be difficult to control. Etch rates of less than 5 Å/min would require significantly longer etch times, which would lead to inefficiencies in the 3D-NAND fabrication process. Preferably, the molybdenum etch rate is from 10-100 Å/min and more preferably from 10-40 Å/min.

The at least one oxidizing agent in the etchant composition of the present disclosure can be any species capable of oxidizing molybdenum to produce a composition-soluble molybdenum species, preferably soluble under alkaline pH conditions. Examples of suitable oxidizing agents include, but are not limited to, hydrogen peroxide ($H_2O_2$), $FeCl_3$, $FeF_3$, $Fe(NO_3)_3$, $Sr(NO_3)_2$, $CoF_3$, $MnF_3$, oxone, ($2KHSO_5 \cdot KHSO_4 \cdot K_2SO_4$), nitric acid ($HNO_3$), ammonium peroxomonosulfate, ammonium chlorite ($NH_4ClO_2$), ammonium chlorate ($NH_4ClO_3$), ammonium iodate ($NH_4IO_3$), ammonium nitrate ($NH_4NO_3$), ammonium perborate ($NH_4BO_3$), ammonium perchlorate ($NH_4ClO_4$), ammonium periodate ($NH_4IO_4$), ammonium persulfate (($NH_4)_2S_2O_8$), ammonium hypochlorite ($NH_4ClO$), ammonium tungstate (($NH_4)_{10}H_2(W_2O_7)$), sodium persulfate ($Na_2S_2O_8$), sodium hypochlorite (NaClO), sodium perborate, potassium iodate ($KIO_3$), potassium permanganate ($KMnO_4$), potassium persulfate ($K_2S_2O_8$), potassium hypochlorite (KClO), tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)S_2O_8$), tetrabutylammonium peroxomonosulfate, peroxomonosulfuric acid, urea hydrogen peroxide (($CO(NH_2)_2)H_2O_2$), peracetic acid ($CH_3(CO)OOH$), t-butyl hydroperoxide, nitrobenzenesulfonate, 1,4-benzoquinone, toluquinone, dimethyl-1,4-benzoquinone, chloranil, alloxan, periodic acid, and combinations thereof. Preferably, the oxidizing agent comprises hydrogen peroxide, urea-hydrogen peroxide, ammonium persulfate, periodic acid, peracetic acid, or t-butyl hydroperoxide.

The oxidizing agent may be present in any amount effective to remove molybdenum from the microelectronic device, particularly in the presence of other metal layers. In particular, the etchant composition may comprise from about 0.1 wt % to about 5 wt % of the oxidizing agent.

Preferably, the amount of oxidizing agent is from about 0.1 wt % to about 2 wt %, and, more preferably, from about 0.1 to about 1 wt %. The oxidizing agent may be introduced directly into the composition or may be prepared as part of an oxidizing agent solution and subsequently combined with the remaining components prior to contacting with the microelectronic device. The latter would further prevent decomposition of the oxidizing agent by minimizing the amount of time it is exposed to alkaline conditions.

The etchant composition further comprises at least one base in order to achieve a pH of the composition to be at least 7.5. Preferably, the pH of the composition is from 7.5 to 13 and more preferably from 8 to 11. Examples of suitable bases include, but are not limited to, alkali metal hydroxides, alkaline earth metal hydroxides, tetraalkyl ammonium hydroxides (such as tetramethylammonium hydroxide (TMAH), tetraethylammonium hydroxide (TEAH), As discussed above, the present etchant composition can be an aqueous composition or can be a semi-aqueous composition. Thus, in some embodiments, the etchant composition comprises water with no additional solvents while, in other embodiments, the etchant composition further comprises water with at least one water-soluble or water-miscible organic solvent. The inclusion of at least one solvent in combination with water may provide additional improvements to the etchant composition, such as improved planarity of the resulting etched molybdenum surface. Suitable solvents include, for example, 2-pyrrolidinone, 1-(2-hydroxyethyl)-2-pyrrolidinone (HEP), glycerol, 1,4-butanediol, tetramethylene sulfone, dimethyl sulfone, methanol, ethanol, isopropanol, butanol, pentanol, hexanol, 2-ethyl-1-hexanol, heptanol, octanol, ethylene glycol, propylene glycol, butylene glycol, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, alkyl carbonates, alkylene carbonates, 4-methyl-2-pentanol, and combinations thereof. Preferably, the at least one solvent comprises propylene glycol. When used, the solvent may be present in amounts from about 10 wt % to about 90 wt % of the total solvent used, preferably from about 30 wt % to about 85 wt % of the total solvent, and more preferably from about 50 wt % to about 85 wt % of the total solvent, with the balance being water.

The etchant composition described herein can be and preferably is substantially devoid of ammonia or ammonium hydroxide. More preferably, the etchant composition is ammonia and ammonium hydroxide free. These bases, while effective at raising the pH to the desired level, present substantial health and environmental concerns and would significantly increase costs for handling and mitigation of these issues.

The base may be present in any amount effective to provide and/or maintain an alkaline pH level. In particular, the etchant composition may comprise from about 0.1 wt % to about 10 wt % of the base. Preferably, the amount of base is from about 0.1 wt % to about 8 wt %, and more preferably, from about 0.1 to about 5 wt %.

The etchant composition of the present disclosure further comprises at least one oxidizing agent stabilizer. As used herein, "oxidizing agent stabilizer" or "stabilizer" includes those compounds that prevent or reduce the decomposition of an oxidizing agent, such as hydrogen peroxide, which diminishes its effectiveness as an oxidant. Oxidizing agent stabilizers can be added to the etchant composition prior to or in combination with the oxidizing agent. Suitable oxidizing agent stabilizers include, but are not limited to, glycine, serine, proline, leucine, alanine, asparagine, aspartic acid, glutamine, valine, and lysine, nitrilotriacetic acid, iminodiacetic acid, etidronic acid, ethylenediaminetetraacetic acid (EDTA), (1,2-cyclohexylenedinitrilo)tetraacetic acid (CDTA), uric acid, tetraglyme, diethylenetriamine pentaacetic acid, propylenediamine tetraacetic acid, ethylenediamine disuccinic acid, sulfanilamide, and combinations thereof. Preferably, the oxidizing agent stabilizer comprises CDTA or EDTA.

Without wishing to be bound by any theory, it is believed that the oxidizing agent stabilizer effectively removes or otherwise traps metal impurities resulting from the removal of the molybdenum material. For example, as discussed above, the molybdenum may include additional metal species such as Al of Ti in low amounts (such as in ppm levels). These metals are known to cause decomposition of oxidizing agents such as hydrogen peroxide, particularly at high pHs. It is believed that the stabilizer binds these metals, thereby reducing the amount of oxidant degradation. For this reason, while the stabilizer may be present in any amount effective to provide increased stability and reduced decomposition of the oxidizing agent, the oxidizing agent stabilizer in general is present in amounts that are less than any complexing agent, discussed in more detail below. For example, the etchant composition may comprise from about 0.0001 wt % to about 1.0 wt % of the oxidizing agent stabilizer. Preferably, the amount of stabilizer is from about 0.0005 wt % to about 0.5 wt %, and, more preferably, from about 0.001 wt % to about 0.1 wt %.

In addition to the components discussed above, the etchant composition of the present disclosure may further comprise, consist of, or consist essentially of optional additional components present to further improve and/or enhance the performance of composition for selective removal of molybdenum from a microelectronic device. For example, the etchant composition may further comprise at least one metal corrosion inhibitor, at least one complexing agent, and/or at least one solvent.

The metal corrosion inhibitor can be used to protect metal layers present on the microelectronic device during the removal of the molybdenum layer. The metal corrosion inhibitor can comprise, consist, or consist essentially of one or more corrosion inhibitors including, but not limited to, 5-aminotetrazole, 5-phenyl-benzotriazole, 1H-tetrazole-5-acetic acid, 1-phenyl-2-tetrazoline-5-thione, benzimidazole, methyltetrazole, pyrazoles, 5-amino-1,3,4-thiadiazole-2-thiol (ATDT), benzotriazole (BTA), 1,2,4-triazole (TAZ), 1,2,3-triazole, tolyltriazole, 5-methyl-benzotriazole (mBTA), 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole (3-ATA), 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-amino-1,2,4-triazole (5-ATA), 3-amino-5-mercapto-1,2,4-triazole, pentylenetetrazole, 5-phenyl-1H-tetrazole, 5-benzyl-1H-tetrazole, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, 4-amino-4H-1,2,4-triazole, 3-amino-5-methylthio-1H-1,2,4-triazole, benzothiazole, imidazole, indiazole, adenine, adenosine, carbazole, and combinations thereof. Preferably, the metal corrosion inhibitor comprises tolyltriazole.

The optional metal corrosion inhibitor may be present in any amount effective to protect metal layers from corrosion, especially at high pH, and without significantly effecting the etch rate of the molybdenum. Thus, the amount of corrosion inhibitor in the etchant composition is an amount that provides an essentially inhibitor independent Mo etch rate. In particular, when used, the etchant composition may comprise from about 0.001 wt % to about 1.0 wt % of the corrosion inhibitor. Preferably, the amount of corrosion inhibitor is from about 0.05 wt % to about 0.5 wt %, and, more preferably, from about 0.01 to about 0.10 wt %.

As used herein, "complexing agent" includes those compounds that are understood by one skilled in the art to be complexing agents, chelating agents and/or sequestering agents. Complexing agents will chemically combine with or physically hold the molybdenmun atoms and/or ions to be removed from the microelectronic device using the compositions described herein, improving the etch rate of this material. Suitable complexing agents include, but are not limited to, aminoethylethanolamine, N-methylaminoethanol, aminoethoxyethanol, dimethylaminoethoxyethanol, diethanolamine, N-methyldiethanolamine, monoethanolamine (MEA), triethanolamine (TEA), 1-amino-2-propanol, 2-amino-1-butanol, isobutanolamine, triethylenediamine, 4-(2-hydroxyethyl)morpholine (HEM), ethylenediamine tetraacetic acid (EDTA), m-xylenediamine (MXDA), iminodiacetic acid (IDA), 2-(hydroxyethyl)iminodiacetic acid (HIDA), nitrilotriacetic acid, thiourea, 1,1,3,3-tetramethylurea, urea, urea derivatives, uric acid, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, 1-hydroxyethylidene-1,1-diphosphonic acid (HEDP), 1,5,9-triazacyclododecane-N,N',N"-tris(methylenephosphonic acid) (DOTRP), 1,4,7,10-tetraazacyclododecane-N,N',N",N"'-tetrakis(methylenephosphonic acid) (DOTP), nitrilotris(methylene)triphosphonic acid, diethylenetriaminepentakis(methylene phosphonic acid) (DETAP), aminotri(methylene phosphonic acid), bis(hexamethylene)triamine pentamethylene phosphonic acid, 1,4,7-triazacyclononane-N,N',N"-tris(methylenephosphonic acid (NOTP), hydroxyethyldiphosphonate, nitrilotris(methylene)phosphonic acid, 2-phosphono-butane-1,2,3,4-tetracarboxylic, carboxyethyl phosphonic acid, aminoethyl phosphonic acid, glyphosate, ethylene diamine tetra (methylenephosphonic acid) phenylphosphonic acid, oxalic acid, succinnic acid, maleic acid, malic acid, malonic acid, adipic acid, phthalic acid, lactic acid, citric acid, sodium citrate, potassium citrate, ammonium citrate, tricarballylic acid, trimethylolpropionic acid, tartaric acid, glucuronic acid, 2-carboxypyridine, 4,5-dihydroxy-1,3-benzenedisulfonic acid disodium salt, and combinations thereof. Preferably, the complexing agent comprises 1-hydroxyethylidene-1,1-diphosphonic acid (HEDP), lactic acid or citric acid.

The optional complexing agent may be present in any amount effective to improve the etch rate of the molybdenum. For example, when used, the etchant composition may comprise from about 0.1 wt % to about 20 wt % of the complexing agent. Preferably, the amount of complexing agent is from about 0.5 wt % to about 15 wt %, and, more preferably, from about 1.0 to about 10 wt %.

As discussed above, the present etchant composition can be an aqueous composition or can be a semi-aqueous composition. Thus, in some embodiments, the etchant composition comprises water with no additional solvents while, in other embodiments, the etchant composition further comprises water with at least one water-soluble or water-miscible organic solvent. The inclusion of at least one solvent in combination with water may provide additional improvements to the etchant composition, such as improved planarity of the resulting etched molybdenum surface. Suitable solvents include, for example, 2-pyrrolidinone, 1-(2-hydroxyethyl)-2-pyrrolidinone (HEP), glycerol, 1,4-butanediol, tetramethylene sulfone, dimethyl sulfone, methanol, ethanol, isopropanol, butanol, pentanol, hexanol, 2-ethyl-1-hexanol, heptanol, octanol, ethylene glycol, propylene glycol, butylene glycol, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, alkyl carbonates, alkylene carbonates, 4-methyl-2-pentanol, and combinations thereof. Preferably, the at least one solvent comprises propylene glycol. When used, the solvent may be present in amounts from about 10 wt % to about 90 wt % of the total solvent used, preferably from about 30 wt % to about 85 wt % of the total solvent, and more preferably from about 50 wt % to about 85 wt % of the total solvent, with the balance being water.

In an embodiment of the etchant composition of the present disclosure, the composition comprises, consists of, or consists essentially of at least one oxidizing agent, at least one oxidizing agent stabilizer, at least one base, and water present in the following ranges, based on the total weight of the composition:

| Component | % by weight | preferred % by weight | more preferred % by weight |
|---|---|---|---|
| oxidizing agent(s) | about 0.1 wt % to about 5 wt % | about 0.1 wt % to about 2 wt % | about 0.1 wt % to about 1 wt % |

-continued

| Component | % by weight | preferred % by weight | more preferred % by weight |
|---|---|---|---|
| oxidizing agent stabilizer(s) | about 0.0001 wt % to about 1 wt % | about 0.0005 wt % to about 0.5 wt % | about 0.001 wt % to about 0.1 wt % |
| base(s) | about 0.1 wt % to about 10 wt % | about 0.1 wt % to about 8 wt % | about 0.1 wt % to about 5 wt % |
| Water | about 84 wt % to about 99.8 wt % | about 89.5 wt % to about 99.8 wt % | about 93.9 wt % to about 99.8 wt % |

It will be appreciated that it is common practice to make concentrated forms of the compositions to be diluted prior to use. For example, the composition may be manufactured in a more concentrated form and thereafter diluted with at least one solvent at the manufacturer, before use, and/or during use at the fab. Dilution ratios may be in a range from about 0.1 part diluent:1 part composition concentrate to about 100 parts diluent:1 part composition concentrate. It should further be appreciated that the compositions described herein include oxidizing agents, which can be unstable over time. Accordingly, the concentrated form can be substantially devoid of oxidizing agent(s) and the oxidizing agent can be introduced to the concentrate or the diluted composition by the manufacturer before use and/or during use at the fab.

The etchant compositions described herein are easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the composition, i.e., more dilute or more concentrated, and it will be appreciated that the compositions can variously and alternatively comprise, consist or consist essentially of any combination of ingredients consistent with the disclosure herein.

Examples

The features and advantages of the etchant compositions of the present disclosure are more fully illustrated by the following non-limiting examples, wherein all parts and percentages are by weight, unless otherwise expressly stated. High pH etchant compositions are shown that are particularly useful for the selective removal of molybdenum from microelectronic devices at an etch rate of 5-200 Å/min.

The etchant compositions were prepared by combining oxidizer and complexing agent adjusted to the target pH using TEAH as the titrator. The mixture was stirred for 15 min at room temperature to afford a clear solution.

Coupons having a Mo layer were placed in a bath containing the compositions for 15 min at 30° C. The amount of Mo removed was measured, and TiN etch rates for these compositions were also determined.

Etchant compositions and their corresponding etch rates are shown in Table 1 below.

TABLE 1

| Ex | Oxidizing Agent | Complexing Agent | Base | pH | Mo Etch rate (Å/min) | TiN Etch rate (Å/min) |
|---|---|---|---|---|---|---|
| 1 | $H_2O_2$ | None | TEAH | 9 | 130 | 0.01 |
| 2 | $H_2O_2$ | None | TEAH | 11 | 89 | 0.01 |
| 3 | urea-$H_2O_2$ | None | TEAH | 9 | 10 | 0.2 |
| 4 | urea-$H_2O_2$ | None | TEAH | 11 | 11 | 0.1 |
| 5 | periodic acid | None | TEAH | 9 | 59 | 0.1 |
| 6 | periodic acid | None | TEAH | 11 | 34 | 1.8 |
| 7 | ammonium persulfate | None | TEAH | 9 | 28 | 0.18 |
| 8 | ammonium persulfate | None | TEAH | 11 | 19 | 0.32 |
| 9 | peracetic acid | None | TEAH | 9 | 40 | 0.01 |
| 10 | peracetic acid | None | TEAH | 11 | 26 | 0.98 |
| 11 | t-butyl hydroperoxide | None | TEAH | 9 | 17 | 0.34 |
| 12 | t-butyl hydroperoxide | None | TEAH | 11 | 15 | 0.2 |
| 13 | $H_2O_2$ | citric acid | TEAH | 9 | 173 | 0.01 |
| 14 | $H_2O_2$ | citric acid | TEAH | 11 | 171 | 0.01 |
| 15 | $H_2O_2$ | lactic acid | TEAH | 11 | 178 | 0.03 |
| 16 | $H_2O_2$ | HEDP | TEAH | 11 | 152 | 0.01 |

Each of these compositions included oxidizing agent at 1 wt % and CDTA as an oxidizing agent stabilizer at 0.01 wt %.

As shown, each of these etchant compositions, comprising at least one oxidizing agent, at least one oxidizing agent stabilizer, and at least one base to a pH of from 7.5 to 13, preferably 8 to 11, controllably removes molybdenum at an etch rate of 5-200 Å/min. In addition, corresponding TiN etch rates are very low, demonstrating the selectivity of the etchant composition for removing Mo.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. An etchant composition for removing molybdenum from a microelectronic device, the etchant composition comprising:
   from about 0.1 wt % to about 2 wt % of at least one oxidizing agent;
   from about 0.0001 wt % to about 1 wt % of at least one oxidizing agent stabilizer selected from the group consisting of glycine, serine, proline, leucine, alanine, asparagine, aspartic acid, glutamine, valine, and lysine, nitrilotriacetic acid, iminodiacetic acid, etidronic acid, ethylenediaminetetraacetic acid (EDTA), (1,2-cyclohexylenedinitrilo)tetraacetic acid (CDTA), uric acid, tetraglyme, diethylenetriamine pentaacetic acid, propylenediamine tetraacetic acid, ethylendiamine disuccinic acid, sulfanilamide, and combinations thereof;
   from about 0.1 wt % to about 10 wt % of at least one base selected from the group consisting of alkali metal hydroxides, alkaline earth metal hydroxides, tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), choline hydroxide, ethyltrimethylammonium hydroxide, tris(2-hydroxyethyl)methyl ammonium hydroxide, diethyldimethylammonium hydroxide, tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide, and combinations thereof; and
   from about 84 wt % to about 99.8 wt % water,
   wherein the etchant composition is free of ammonia or ammonium hydroxide and has a pH of from 9 to 11.

2. The etchant composition of claim 1, wherein the oxidizing agent comprises a species selected from the group consisting of hydrogen peroxide ($H_2O_2$), $FeCl_3$, $FeF_3$, $Fe(NO_3)_3$, $Sr(NO_3)_2$, $CoF_3$, $MnF_3$, oxone, oxone ($2KHSO_5 \cdot KHSO_4 \cdot K2SO_4$), nitric acid ($HNO_3$), ammonium peroxomonosulfate, ammonium chlorite ($NH_4ClO_2$), ammonium chlorate ($NH_4ClO_3$), ammonium iodate ($NH_4IO_3$), ammonium nitrate ($NH_4NO_3$), ammonium perborate ($NH_4BO_3$), ammonium perchlorate ($NH_4ClO_4$), ammonium periodate ($NH_4IO_4$), ammonium persulfate (($NH_4)_2S_2O_8$), ammonium hypochlorite ($NH_4ClO$), ammonium tungstate (($NH_4)_{10}H_2(W_2O_7)$), sodium persulfate ($Na_2S_2O_8$), sodium hypochlorite (NaClO), sodium perborate, potassium iodate ($KIO_3$), potassium permanganate ($KMnO_4$), potassium persulfate ($K_2S_2O_8$), potassium hypochlorite (KClO), tetramethylammonium chlorite ((N($CH_3$)$_4$)$ClO_2$), tetramethylammonium chlorate ((N($CH_3$)$_4$)$ClO_3$), tetramethylammonium iodate ((N($CH_3$)$_4$)$IO_3$), tetramethylammonium perborate ((N($CH_3$)$_4$)$BO_3$), tetramethylammonium perchlorate ((N($CH_3$)$_4$)$ClO_4$), tetramethylammonium periodate ((N($CH_3$)$_4$)$IO_4$), tetramethylammonium persulfate ((N($CH_3$)$_4$)$S_2O_8$), tetrabutylammonium peroxomonosulfate, peroxomonosulfuric acid, urea hydrogen peroxide ((CO($NH_2$)$_2$)$H_2O_2$), peracetic acid ($CH_3$(CO)OOH), t-butyl hydroperoxide, nitrobenzensulfonate, 1,4-benzoquinone, toluquinone, dimethyl-1,4-benzoquinone, chloranil, alloxan, periodic acid, and combinations thereof.

3. The etchant composition of claim 1, wherein the at least one oxidizing agent comprises hydrogen peroxide, urea-hydrogen peroxide, ammonium persulfate, periodic acid, peracetic acid, or t-butyl hydroperoxide.

4. The etchant composition of claim 1, wherein the etchant composition comprises from about 0.1 wt % to about 1 wt % of the at least one oxidizing agent.

5. The etchant composition of claim 1, wherein the oxidizing agent stabilizer comprises CDTA or EDTA.

6. The etchant composition of claim 1, wherein the etchant composition comprises from about 0.0005 wt % to about 0.5 wt % of the at least one oxidizing agent stabilizer.

7. The etchant composition of claim 1, wherein the base comprises tetraethylammonium hydroxide, choline hydroxide, or combinations thereof.

8. The etchant composition of claim 1, wherein the etchant composition comprises from about 0.1 wt % to about 5 wt % of the base.

9. The etchant composition of claim 1, wherein the etchant composition further comprises at least one complexing agent.

10. The etchant composition of claim 9, wherein the at least one complexing agent comprises a species selected from the group consisting of aminoethylethanolamine, N-methylaminoethanol, aminoethoxyethanol, dimethylaminoethoxyethanol, diethanolamine, N-methyldiethanolamine, monoethanolamine (MEA), triethanolamine (TEA), 1-amino-2-propanol, 2-amino-1-butanol, isobutanolamine, triethylenediamine, 4-(2-hydroxyethyl)morpholine (HEM), ethylenediamine tetraacetic acid (EDTA), m-xylenediamine (MXDA), iminodiacetic acid (IDA), 2-(hydroxyethyl)iminodiacetic acid (HIDA), nitrilotriacetic acid, thiourea, 1,1,3,3-tetramethylurea, urea, uric acid, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, 1-hydroxyethylidene-1,1-diphosphonic acid (HEDP), 1,5,9-triazacyclododecane-N,N',N'''-tris(methylenephosphonic acid) (DOTRP), 1,4,7,10-tetraazacyclododecane-N,N',N''', N'-tetrakis(methylenephosphonic acid) (DOTP), nitrilotris (methylene)triphosphonic acid, diethylenetriaminepentakis (methylene phosphonic acid) (DETAP), aminotri(methylene phosphonic acid), bis(hexamethylene)triamine pentamethylene phosphonic acid, 1,4,7-triazacyclononane-N,N',N''-tris (methylenephosphonic acid (NOTP), hydroxyethyldiphosphonate, nitrilotris(methylene)phosphonic acid, 2-phosphono-butane-1,2,3,4-tetracarboxylic, carboxyethyl phosphonic acid, aminoethyl phosphonic acid, glyphosate, ethylene diamine tetra(methylenephosphonic acid) phenylphosphonic acid, oxalic acid, succinnic acid, maleic acid, malic acid, malonic acid, adipic acid, phthalic acid, citric acid, sodium citrate, potassium citrate, ammonium citrate, tricarballylic acid, trimethylolpropionic acid, tartaric acid, glucuronic acid, 2-carboxypyridine, 4,5-dihydroxy-1,3-benzenedisulfonic acid disodium salt, and combinations thereof.

11. The etchant composition of claim 1, wherein the etchant composition further comprises at least one organic solvent.

12. The etchant composition of claim 11, wherein the at least one organic solvent comprises a species selected from the group consisting of 2-pyrrolidinone, 1-(2-hydroxyethyl)-2-pyrrolidinone (HEP), glycerol, 1,4-butanediol, tetramethylene sulfone, dimethyl sulfone, ethylene glycol, propylene glycol, dipropylene glycol, tetraglyme, diglyme, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (DEGBE), triethylene glycol monobutyl ether (TEGBE), ethylene glycol monohexyl ether (EGHE), diethylene glycol monohexyl ether (DEGHE), ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, or propylene glycol phenyl ether, and combinations thereof.

13. The etchant composition of claim 11, wherein the at least one organic solvent is propylene glycol.

14. The etchant composition of claim 1, wherein the etchant composition further comprises at least one metal corrosion inhibitor.

15. The etchant composition of claim 14, wherein the at least one metal corrosion inhibitor comprises a species selected from the group consisting of 5-aminotetrazole, 5-phenyl-benzotriazole, 1H-tetrazole-5-acetic acid, 1-phenyl-2-tetrazoline-5-thione, benzimidazole, methyltetrazole, pyrazoles, 5-amino-1,3,4-thiadiazole-2-thiol (ATDT), benzotriazole (BTA), 1,2,4-triazole (TAZ), 1,2,3-triazole, tolyltriazole, 5-methyl-benzotriazole (mBTA), 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole (3-ATA), 3-mercapto-1,2,4-triazole, 3-isopropyl-1-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-amino-1,2,4-triazole (5-ATA), 3-amino-5-mercapto-1,2,4-triazole, pentylenetetrazole, 5-phenyl-1H-tetrazole, 5-benzyl-1H-tetrazole, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, 4-amino-4H-1,2,4-triazole, 3-amino-5-methylthio-1H-1,2,4-triazole, benzothiazole, imidazole, indiazole, adenine, adenosine, carbazole, and combinations thereof.

16. The etchant composition of claim 15, wherein the at least one metal corrosion inhibitor is tolyltriazole.

17. A method of removing molybdenum from a microelectronic device the method comprising:
  i) contacting the microelectronic device with an etchant composition for a time sufficient to at least partially remove the molybdenum from the microelectronic device, the etchant composition comprising:
  from about 0.1 wt % to about 2 wt % of at least one oxidizing agent;
  from about 0.0001 wt % to about 1 wt % of at least one oxidizing agent stabilizer selected from the group consisting of glycine, serine, proline, leucine, alanine, asparagine, aspartic acid, glutamine, valine, and lysine, nitrilotriacetic acid, iminodiacetic acid, etidronic acid, ethylenediaminetetraacetic acid (EDTA), (1,2-cyclohexylenedinitrilo)tetraacetic acid (CDTA), uric acid, tetraglyme, diethylenetriamine pentaacetic acid, propylenediamine tetraacetic acid, ethylendiamine disuccinic acid, sulfanilamide, and combinations thereof; and
  from about 0.1 wt % to about 10 wt % of at least one base selected from the group consisting of alkali metal hydroxides, alkaline earth metal hydroxides, tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), choline hydroxide, ethyltrimethylammonium hydroxide, tris(2-hydroxyethyl)methyl ammonium hydroxide, diethyldimethylammonium hydroxide, tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide, and combinations thereof; and
  from about 84 wt % to about 99.8 wt % water, and
  ii) etching molybdenum at an etch rate of 5-200 Å/min, wherein the etchant composition is free of ammonia or ammonium hydroxide and has a pH of from 9 to 11.

* * * * *